March 13, 1962 S. M. KERBER ET AL 3,025,395

RESONANT CAVITY TYPE RADIO FREQUENCY CONVERTER

Filed Nov. 19, 1958 2 Sheets-Sheet 1

INVENTORS.
STANLEY M. KERBER
GRANT M. RANDALL
ROBERT E. HOVDA
BY Edward A. Sokolski
AGENT INVENTORS.
STANLEY M. KERBER
GRANT M. RANDALL
BY ROBERT E. HOVDA
Edward A. Sokolski
AGENT 3,025,395
RESONANT CAVITY TYPE RADIO FREQUENCY CONVERTER Stanley M. Kerber, Fullerton, Grant M. Randall, Whittier, and Robert E. Hovda, Buena Park, Calif., assignors to North American Aviation, Inc.

Filed Nov. 19, 1958, Ser. No. 775,004
5 Claims. (Cl. 250—20)

Figure 1:
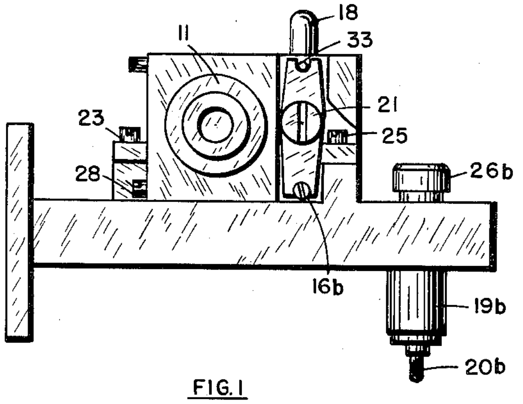

This invention relates to a resonant cavity type radio frequency converter and more particularly to such a converter having a low noise figure without utilizing a filter or resorting to balanced operation.

Most radar systems and point to point communications systems now in use operate in the UHF and SHF ranges. In such systems, the converter utilized to convert the input signals to a suitable intermediate frequency often uses a high frequency local oscillator such as a velocity modulated tube of the reflex klystron type. With the increased demand for greater ranges and improved performance, much effort has been devoted to minimizing the noise generated in the converter device. This has been accomplished thus far in two general manners: (1) the utilization of a narrow band frequency filter between the output of the local oscillator and the mixer device, and (2) the utilization of a balanced crystal mixer with proper orientation of the crystal diodes and arrangement of the intermediate frequency input circuitry. Both of these solutions to the converter generated noise problem have decided disadvantages.

The use of a filter cavity in the local oscillator distribution seriously restricts the electronic tuning range of a reflex klystron. If the filter cavity is to be effective, the bandpass of the filter should generally be no more than about 5 megacycles. The electronic tuning range of the oscillator would be restricted to the bandpass of the filter. Any change in frequency greater than the bandpass of the filter would require a mechanical change in the filter cavity. Also the use of such a filter cavity makes it very difficult to tune a velocity modulated oscillator such as a reflex klystron.

The balanced mixer, while very effective in minimizing noise in the converter output, involves increased complexity and size in the converter. This is due to the requirement for a more complicated local oscillator distribution system and the necessity for an additional mixer unit for each mixer unit which would ordinarily be utilized in a particular single ended converter. This means that a balanced converter utilized in a radar system having dual mixers such as systems having sum and difference channels (see for example Patent No. 2,817,835 to H. R. Worthington, Jr., issued December 24, 1957) will require four mixer units instead of two. The additional space requirement for a balanced converter in such a system may make it difficult to meet the restricted space requirements often imposed in the design of airborne systems. The increase in size, weight, and complexity necessitated by the use of a balanced mixer would be desirable to avoid if possible in any situation.

The device of this invention provides a single ended converter unit which has as low a noise figure as a well designed balanced mixer converter or one having a filter in the local oscillator output. This is basically accomplished (1) by utilizing a high "Q" resonant cavity external to the local oscillator to which the local oscillator output is directly coupled and (2) by keeping the amount of energy coupled from this cavity to an adjacent waveguide section in which the mixer device is located to the minimum value commensurate with proper mixer operation. Energy is coupled from the resonant cavity to the waveguide section housing the mixer by means of a coupling iris formed by contiguous apertures in the adjacent walls of the resonant cavity and the waveguide section. The coupling through this iris may be adjusted by an appropriate coupling adjustment. Due to the fact that the resonant cavity is tuned to the signal frequency plus or minus the intermediate frequency there will be little coupling of the incoming signals through the irises to the resonant cavity.

Thus, by providing high "Q" tuning of the local oscillator signal and by keeping the coupling of this signal to the mixer at the lowest level possible, the device of this invention is enabled to have a noise characteristic comparable to that of a system using balanced mixer units and heretofore unattainable in a single ended device without resorting to undesirable filtering of the local oscillator output.

It is therefore an object of this invention to provide an improved radio frequency converter utilizing single ended mixers.

It is a further object of this invention to provide a new and improved converter unit for use in radio frequency systems operating in the UHF range and higher which has a low noise figure.

It is still a further object of this invention to minimize the size, weight, and complexity of UHF and SHF converters without compromising their low noise characteristics.

It is still another object of this invention to provide a simpler and more compact UHF and SHF converter having low noise characteristics.

It is a still further object of this invention to improve the noise figure of radio frequency converter units using single ended mixers.

Figure 2:
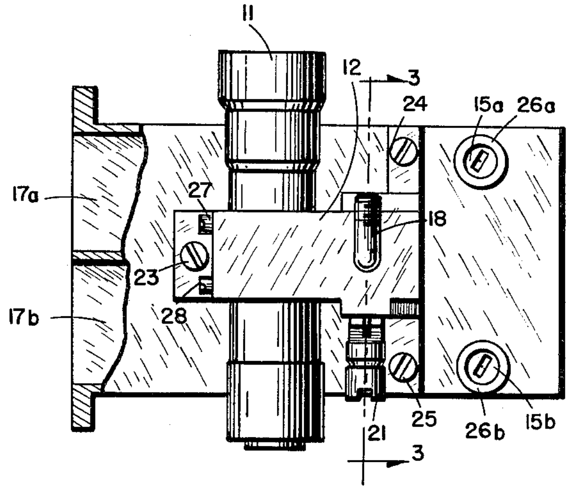
Figure 3:
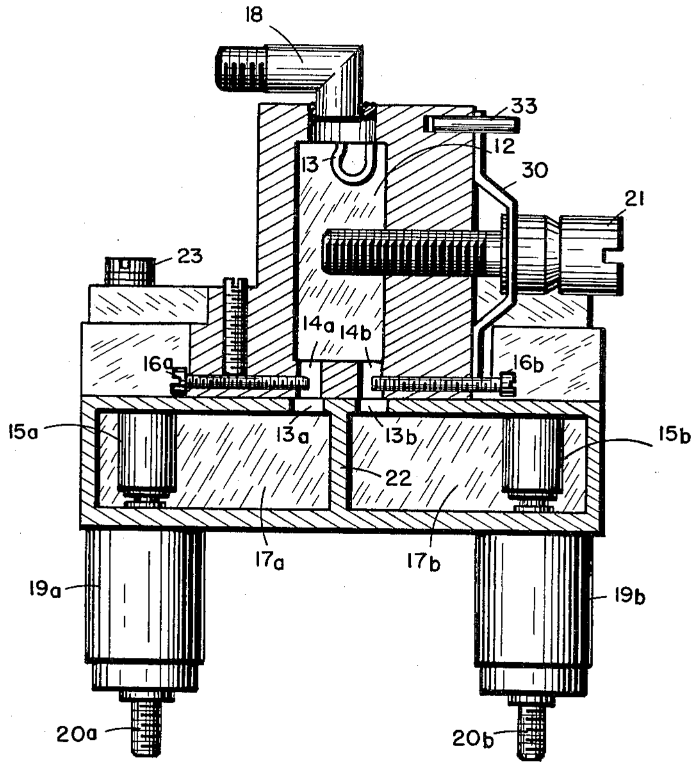

Other objects of this invention will become apparent from the following description taken in connection with the accompanying drawings in which FIG. 1 is an end view of a preferred embodiment of the invention, FIG. 2 is a top view of the embodiment of FIG. 1, and FIG. 3 is a cross-sectional view taken along a plane as indicated by the line 3—3 in FIG. 2.

Referring to FIGS. 1, 2 and 3, a preferred embodiment of the device of the invention is illustrated. A velocity modulated reflex klystron oscillator 11 is mounted with its output coupled in conventional fashion into resonant cavity 12. The resonant cavity is designed so that it will resonate within the desired output frequency range of the reflex klystron. The resonant frequency of cavity 12 may be adjusted by means of a frequency adjusting a plug 21, a portion of which intrudes within the cavity to change the characteristics of a portion thereof, thereby enabling frequency change. Two similar adjacent waveguide sections 17*a* and 17*b* which may have a common wall 22 are fixedly attached to the resonant cavity by means such as machine screws 23, 24, and 25, one of the walls of each of waveguide sections 17*a* and 17*b* being adjacent to one wall of cavity 12. The wall of the cavity 12 adjacent the waveguide sections has apertures 14*a* and 14*b* therein, each of these apertures being contiguous with a similar aperture 13*a* and 13*b* respectively in the adjacent walls of each of the waveguide sections. Each of these contiguous apertures forms a coupling iris between the resonant cavity 12 and one of the waveguide sections. The amount of coupling through each of these irises may be adjusted by means of an iris coupling adjustment screw 16*a* and 16*b* which respectively enter each iris and thereby enable the adjustment of its effective dimensions. Iris adjustment screws 16*a* and 16*b* may be suitable metal screws threaded to engage mating portions in the cavity wall.

The size and position of apertures 14*a*, 14*b*, and 13*a* and 13*b* are not critical as long as the corresponding apertures in the cavity wall and the waveguide section wall are substantially contiguous. They must, however, be positioned and of such a dimension so as to permit the coupling of a predetermined minimum signal from the cavity to the waveguide sections within the range of iris adjustment screws 16*a* and 16*b*.

Mounted within each of the waveguide sections in appropriate crystal holders 26*a* and 26*b* are crystal mixer devices 15*a* and 15*b*. These crystal devices may be conventional crystal diodes which will operate in the frequency ranges utilized, such as for example the type 1N23D which is suitable for utilization in the SHF range and below. The input signals from the antenna or other source are coupled directly into waveguide sections 17*a* and 17*b*. The received signals entering the waveguide are not affected by the presence of the local oscillator cavity because the coupling irises and the cavity present a very high reactance at the signal frequency and effectively short-circuit the resonant cavity coupling at this frequency. This is so because the high "Q" resonant cavity 12 being tuned to the local oscillator frequency, which is separated from the signal frequency by the intermediate frequency, offers high impedance to frequencies separated from the local oscillator frequency by as much as the intermediate frequency.

Intermediate frequency signal output may be coupled to an intermediate frequency amplifier (not shown) by means of any suitable device such as radio frequency coupling chokes 19*a* and 19*b*. One of the electrodes of each of the mixer diodes 15*a* and 15*b* is coupled to the center conductor of a corresponding choke in conventional fashion, the intermediate frequency signals appearing between choke center conductors 20*a* and 20*b* and the grounded outer conductors of these chokes.

Tuning plug 21 may be mounted on any suitable wall of resonant cavity 12 being threaded therewith and appropriately tensioned by any suitable means such as spring metal standoff 30 which may be kept from sliding by slots therein which engage pin 33 mounted on the cavity wall and iris adjustment screw 16*b*.

A local oscillator signal for use, for example, in automatic frequency control circuits may be coupled out by means of pickup loop 13 and connector 18 fixedly mounted on a wall of resonant cavity 12.

While the device of this invention has been illustrated with dual antenna sections and mixers for dual channel operation, it is obvious that equal results can be achieved where only a single channel is required. In such a case one of the waveguide sections and mixer units may be eliminated as well as one of the coupling irises.

In the device of this invention it is possible to couple only the amount of energy that is needed to realize proper heterodyne action from the local oscillator to the mixer units. Such minimum coupling enhances low noise operation because local oscillator loading is at an absolute minimum. This minimum loading feature increases the loaded "Q" of the already high "Q" external cavity, and in this manner the amount of noise in the receiver pass band is further decreased. The iris coupling adjustments 16*a* and 16*b* should be adjusted to give the minimum local oscillator mixer coupling commensurate with proper heterodyne action in the mixer circuits.

The device of this invention thus provides a simple yet efficient low noise converter using a single ended mixer. Tests indicate that the device of this invention has a noise figure as good as that of a well designed balanced mixer and of course far superior to that of conventional converters with single ended mixers.

While the device of this invention has been described and illustrated in detail, it is to be clearly understood that the same is by way of illustration and example only and is not to be taken by way of limitation, the spirit and scope of this invention being limited only by the terms of the appended claims.

We claim:

1. In a two-channel radio frequency converter having a local oscillator for both channels, a resonant cavity coupled to said local oscillator to receive the output thereof, means for varying the resonant frequency of said cavity, first and second waveguide sections mounted adjacent said cavity, one outer wall of each of said waveguide sections abutting against an outer wall of said cavity, a separate adjustable coupling iris between said cavity and each of said waveguide sections, first and second single ended mixer devices mounted in respective ones of said waveguide sections, and first and second means for coupling the output of each of said mixer devices to first and second loads, respectively.

2. The device as recited in claim 1 wherein each of said adjustable irises comprises adjacent portions of said cavity and waveguide sections having contiguous apertures therein and an adjusting screw adjustably mounted on one wall of said resonant cavity, a portion of said adjusting screw being adjustably positioned within one of said apertures.

3. A radio frequency converter comprising a velocity modulated oscillator, a resonant cavity external to said oscillator coupled to said oscillator output, first and second waveguide sections mounted adjacent said cavity, one outer wall of each of said waveguide sections abutting against an outer wall of said resonant cavity, a separate adjustable coupling iris between said cavity and each of said waveguide sections, a crystal diode mixer mounted in each of said waveguide sections, a separate radio frequency coupling choke having a center and an outer conductor mounted on each of said waveguide sections, one electrode of each of said diodes being connected to the center conductor of its associated coupling choke, and a tuning plug mounted on one wall of said resonant cavity, a portion of said tuning plug being adjustably mounted within said resonant cavity.

4. The device as recited in claim 3 wherein said coupling irises comprise apertures in each of said waveguide walls and the abutting wall of said resonant cavity, each of said waveguide apertures being contiguous to a separate aperture in said abutting wall of said resonant cavity, and coupling adjustment screws adjustably mounted on separate walls of said cavity, a portion of each of said screws being adjustably positioned within a respective one of said apertures.

5. The device as recited in claim 4 and additionally comprising a pickup mounted within said cavity and means for transferring energy from said pickup to a load.

References Cited in the file of this patent

UNITED STATES PATENTS

| | | |
|---|---|---|
| 2,517,731 | Sproull | Aug. 8, 1950 |
| 2,530,603 | Dorgelo | Nov. 21, 1950 |
| 2,547,412 | Salisbury | Apr. 3, 1951 |
| 2,550,409 | Fernsler | Apr. 24, 1951 |
| 2,567,825 | Pound | Sept. 11, 1951 |
| 2,572,880 | Riebman | Oct. 30, 1951 |
| 2,710,346 | Schmidt | June 7, 1955 |
| 2,790,073 | Curtis | Apr. 23, 1957 |
| 2,806,138 | Hopper | Sept. 10, 1957 |
| 2,834,884 | Domenichini et al. | May 13, 1958 |
| 2,850,626 | Tomiyasu | Sept. 2, 1958 |
| 2,863,042 | Sanders et al. | Dec. 2, 1958 |